United States Patent [19]
Duong et al.

[11] Patent Number: 5,583,452
[45] Date of Patent: Dec. 10, 1996

[54] TRI-DIRECTIONAL BUFFER

[75] Inventors: Khue Duong; Stephen M. Trimberger, both of San Jose, Calif.

[73] Assignee: Xilinx, Inc., San Jose, Calif.

[21] Appl. No.: 548,926

[22] Filed: Oct. 26, 1995

[51] Int. Cl.$^6$ .............................................. H03K 19/0944
[52] U.S. Cl. ................. 326/49; 326/86; 326/47
[58] Field of Search ................. 326/50, 49, 45, 326/44, 86, 47

[56] References Cited

U.S. PATENT DOCUMENTS

| | | | |
|---|---|---|---|
| 4,695,740 | 9/1987 | Carter | 326/86 |
| 4,713,557 | 12/1987 | Carter | 326/86 |
| 4,835,418 | 5/1989 | Hsieh | 326/86 |
| 4,987,319 | 1/1991 | Kawana | 326/86 |
| 5,107,148 | 4/1992 | Millman | 326/56 |
| 5,202,593 | 4/1993 | Huang et al. | 326/86 |
| 5,450,022 | 9/1995 | New | 326/44 |
| 5,455,525 | 10/1995 | Ho et al. | 326/39 |

*Primary Examiner*—Edward P. Westin
*Assistant Examiner*—Benjamin D. Driscoll
*Attorney, Agent, or Firm*—Jeanette S. Harms; Anthony C. Murabito

[57] ABSTRACT

A configurable multi-directional buffer circuit for a programmable integrated circuit. The novel buffer circuit is a configurable multi-directional buffer circuit having one pair of inverters and having a first input/output line and a second input/output line and a third input line multiplexed with the first input/output line. The novel buffer circuit is configurable to allow a signal from the first input/output line to be driven over the second input/output line or configurable to allow a signal from the second input/output line to be driven over the first input/output line. The novel buffer circuit also allows a signal over the third input line to be driven over the second input/output line. In either case, only a single pair of inverter circuits are used. In an alternate embodiment, the novel buffer allows signal over a fourth input line to be driven over the first input/output line. The novel buffer is configurable to realize any of the above configurations using programmable memory cells and therefore is well suited for application within a programmable integrated circuit. Since the novel buffer utilizes only a single pair of inverters to provide the buffering, in any configuration, it does not contain unused driver circuitry when configured. Therefore, the novel buffer advantageously consumes a relatively small amount of substrate area.

22 Claims, 7 Drawing Sheets

TRI-DIRECTIONAL BUFFER

BACKGROUND OF THE INVENTION

1. Field of the Invention

The present invention relates to the field of signal drivers. More specifically, the present invention relates to the field of signal drivers within a programmable integrated circuit.

2. Background Technology

Programmable integrated circuits (ICs), such as field programmable gate arrays (FPGAs) utilize a number of drivers circuits ("buffers") to transmit signals internally and externally. Since the FPGAs contain a number of configurable logic circuits, the FPGAs also contain configurable or programmable interconnect structures ("interconnect structure") which allow a great degree of flexibility in coupling together the input and output signals of the configurable logic circuits. The interconnect structure, as is well known in the art, comprises a number of signal lines disposed between configurable logic circuits. The interconnect structure also contains a number of programmable interconnect points (PIPs) located at the intersection of signal lines. Each PIP comprises a pass transistor coupling the two intersecting signal lines. The pass transistor is controlled by a memory unit (e.g., antifuse or SRAM, etc.) whose programmed state determines whether or not the two intersecting lines are electrically coupled. PIPs of the kind described above are also well known in the art.

Since the interconnect structure is programmable, any given signal line within the interconnect structure can be driven by a number of different configurable logic circuits. Therefore, any given signal line of the interconnect structure can be driven in either direction depending on the particular configuration programmed into the interconnect structure. This particular characteristic of the signal lines can be problematic for signal buffering because signal buffering is typically performed using directional elements.

As a result, programmable interconnect structures of the past utilize configurable bi-directional buffers that allow a particular signal to be buffered in either direction along a signal line. Each configurable bi-directional buffer is programmable in that the particular direction for buffering is programmed into the bi-directional buffer during FPGA initialization (e.g., when the program information is loaded into the FPGA to configure the FPGA for operation).

A number of different bi-directional buffers are known in the art, see Hsieh U.S. Pat. No. 4,835,418 (May 30, 1989), entitled "Three State Bi-Directional Buffer," and Carter U.S. Pat. No. 4,695,740 (Sep. 22, 1987) entitled "BiDirectional Buffer Amplifier," and Carter U.S. Pat. No. 4,713,557 (Dec. 15, 1987) entitled "Bi-Directional Buffer Amplifier."

FIG. 1 illustrates one prior art bi-directional buffer circuit 10. This circuit 10 contains two input/output lines 20 and 22 and contains two programmable memory cells 12 and 14. The input/output lines 20 and 22 are part of the interconnect structure. The circuit 10 also contains two inverter circuits 16 and 18 to provide signal buffering. When memory cell 12 is "1" and memory cell 14 is "0," n-type transistors 30a and 32b are ON, and transistors 30b and 32a are OFF. This configuration allows an input signal over line 20 to be buffered and output over line 22. When memory cell 12 is "0" and memory cell 14 is "1," n-type transistors 30b and 32a are ON, and transistors 30a and 32b are OFF. This configuration allows an input signal over line 22 to be buffered and output over line 20. When both memory cells are programmed "0," the circuit 10 is an open circuit across lines 20 and 22.

In the past, these bi-directional buffers have been used to buffer long lines within the programmable interconnect structure. In many applications, an auxiliary or secondary line is to be buffered within the interconnect structure. More specifically, it is often desired to buffer the auxiliary line into the long lines of the interconnect structure. Although satisfactory in many applications, the above referenced bi-directional buffers are not entirely satisfactory for providing signal buffering for these auxiliary signal lines because the bi-directional buffers have only two input/output lines.

Accordingly, it is desirable to implement a buffer circuit that can readily allow bi-directional buffering between a first and a second input/output line but can also provide buffering for an auxiliary signal line. The present invention provides a circuit with such advantageous functionality. Secondly, it would be advantageous to provide such a buffer circuit using only a minimal number of signal driving circuits in order to maintain small the overall substrate area required to implement the buffer circuit. The present invention provides a buffer circuit with this advantageous characteristic.

SUMMARY OF THE INVENTION

A configurable multi-directional buffer circuit is described for a programmable integrated circuit. The novel buffer circuit is a configurable multi-directional buffer circuit having one pair of inverters for each buffer configuration and having a first input/output line, a second input/output line, and a third input line multiplexed with the first input/output line. The novel buffer circuit contains a configurable transistor network configurable to allow a signal from the first input/output line to be driven over the second input/output line or configurable to allow a signal from the second input/output line to be driven over the first input/output line. The novel buffer circuit also allows a signal over the third input line to be driven over the second input/output line. In either configuration, only a single pair of inverter circuits are used. In an alternate embodiment, the novel buffer contains a fourth input line multiplexed with the second input/output line and allows a signal over the fourth input line to be driven over the first input/output line. The novel buffer is configurable by programmable memory cells to realize any of the above configurations and therefore is well suited for application within a programmable integrated circuit, such as a field programmable gate array. Since the novel buffer utilizes only a single pair of inverters to provide signal buffering, in any configuration, it does not contain unused driver circuitry when configured. Therefore, the novel buffer advantageously consumes a relatively small amount of substrate area.

Specifically, embodiments of the present invention include a buffer circuit having a first input/output line coupled to a first transistor through a multiplexer and coupled to a second transistor; a second input/output line coupled to a third and fourth transistor; a third input line coupled to the first transistor through the multiplexer; a driver circuit coupled to the first transistor, the second transistor, the third transistor and the fourth transistor; and programmable memory coupled to control the first transistor, the second transistor, the third transistor and the fourth transistor in configurations such that a signal from the first input/output line is driven by the driver circuit over the second input/output line in one configuration, a signal from the second input/output line is driven by the driver circuit over the first input/output line in a second configuration, and a signal from the third input line is driven by the driver circuit over the second input/output line in a third configuration.

Embodiments of the present invention further include the above and wherein the multiplexer circuit further having a programmable memory cell for selecting between the first input/output line and the third input line in the first and third configurations and wherein the programmable memory comprises a first memory cell and a second memory cell wherein the first memory cell is coupled to gates of the first and third transistors and the second memory cell is coupled to gates of the second and fourth transistors. Embodiments of the present invention further include the above and wherein the driver circuit comprises a pair of serially coupled inverter circuits.

DETAILED DESCRIPTION OF THE INVENTION

In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail as not to unnecessarily obscure aspects of the present invention.

Figure 1:
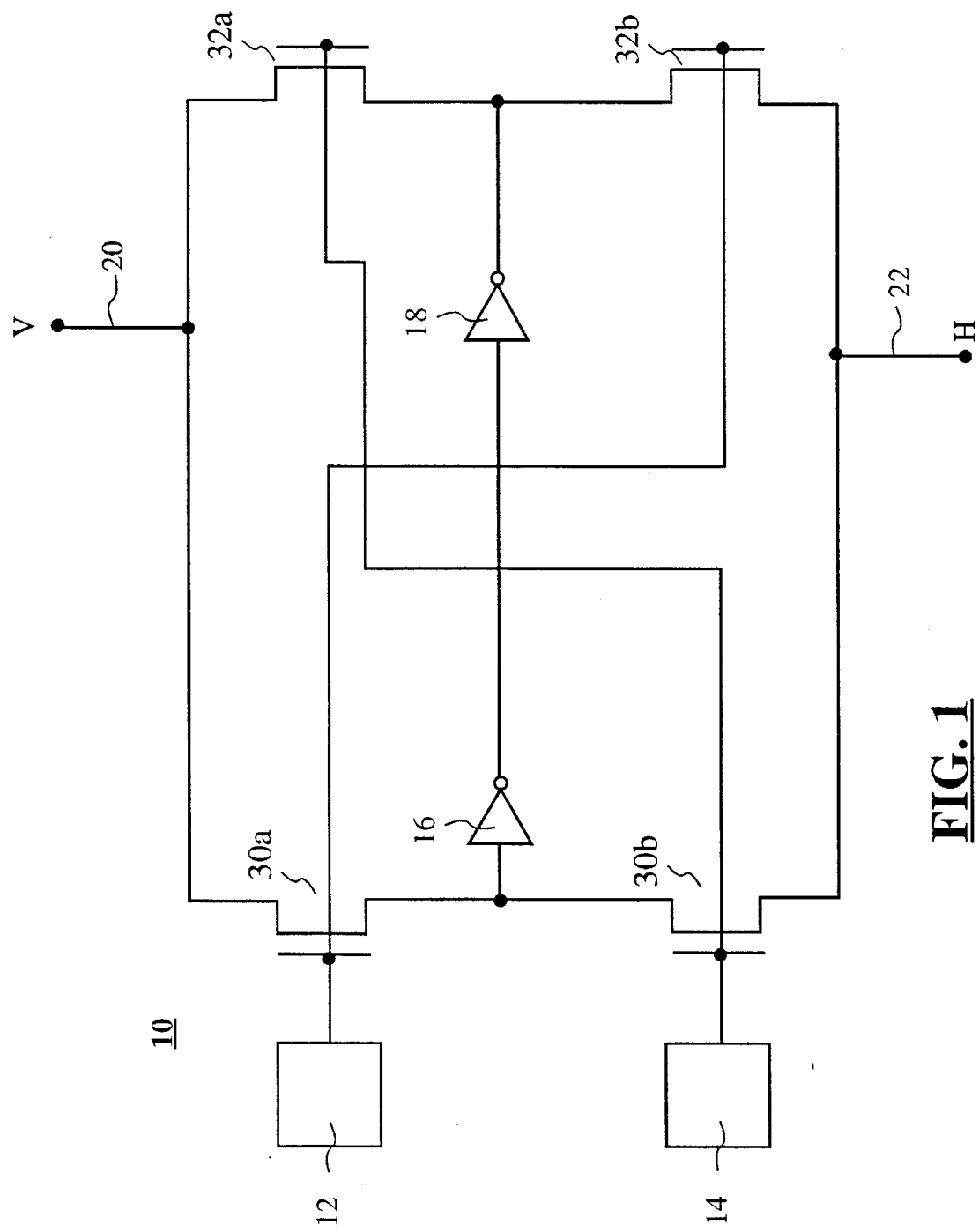
FIG. 1 illustrates a prior art implementation of a bidirectional buffer circuit.
Figure 2:
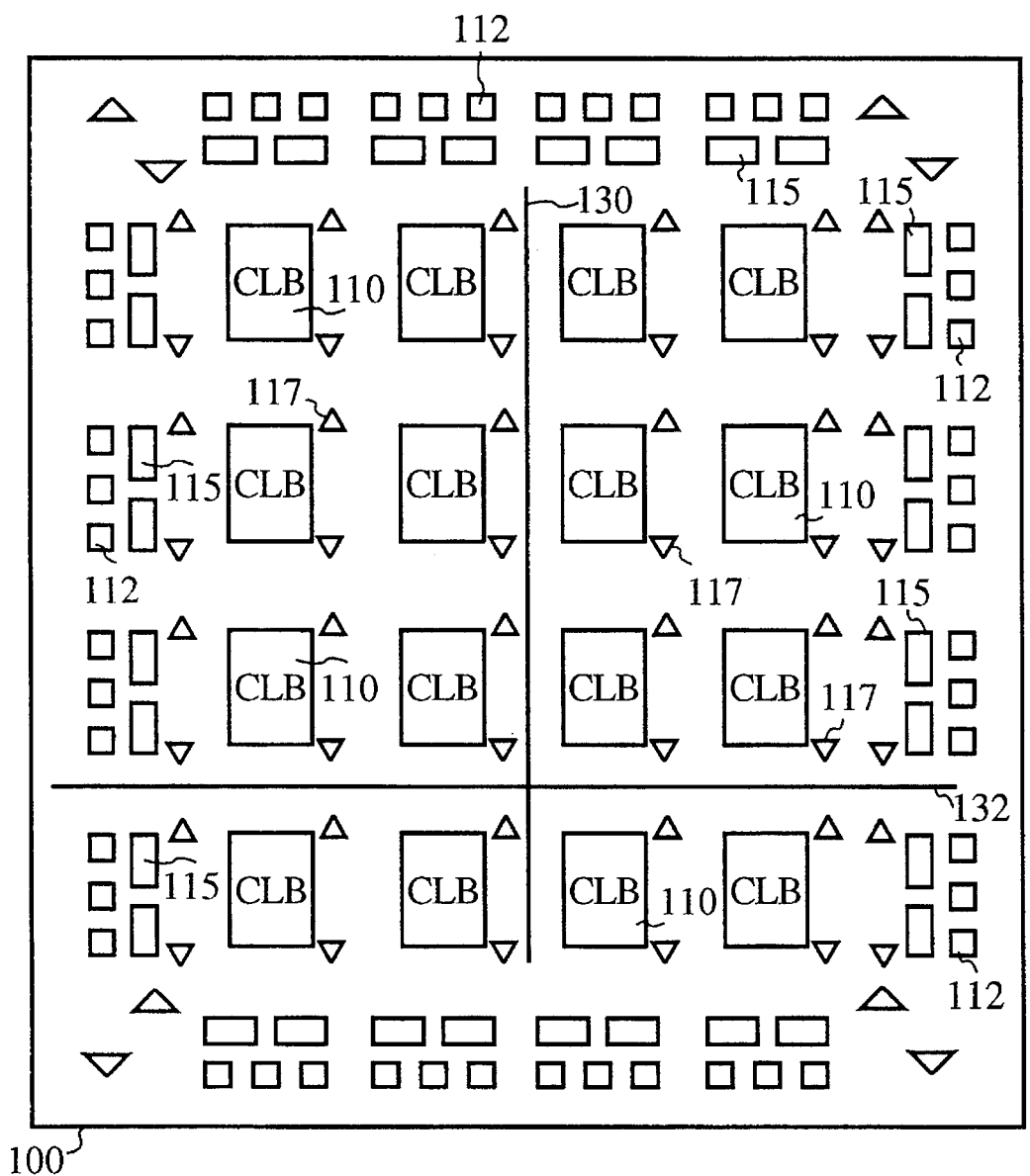
FIG. 2 is a logical block diagram of a programable integrated circuit in accordance with an embodiment of the present invention.

With reference to FIG. 2, a logical block diagram of a programmable integrated circuit, such as a field programmable gate array (FPGA) 100 of the present invention, is illustrated. The FPGA 100 is composed of an array of configurable logic circuits or blocks (CLBs) 110. Along the periphery of FPGA 100 are a number of input/output circuits or blocks (IOBs) 115. Each IOB 115 interfaces with an integrated circuit pad (not shown) of the FPGA 100 for driving signals over the pad and for receiving signals from the pad. Decoder circuits 112 can also be optionally placed along the periphery of FPGA 100. While convenient to place these circuits in the periphery of FPGA 100, it is appreciated that the IOBs 115 and the decoders 112 can also be placed in other locations within FPGA 100 in lieu of its periphery.

FPGA 100 of FIG. 2 also contains an internal programmable interconnect structure (not shown in its entirety). The programmable interconnect structure provides programmable signal pathways between the configurable logic circuits of the FPGA 100 (e.g., between individual CLBs 110 and between IOBs 115 and CLBs 110). The interconnect structure contains buffers 117 to buffer signals within the interconnect structure. The interconnect structure also contains vertical long lines 130 (one is shown) for supplying commonly used signals throughout a column of CLBs 110. The interconnect structure also contains horizontal long lines 132 (one is shown) for supplying commonly used signals throughout a row of CLBs 110.

As discussed more fully below, the embodiments of the multidirectional buffer circuit of the present invention is well suited for placement within the programmable interconnect structure of the FPGA 100 of FIG. 2. More specifically, the multi-directional buffer circuit of the present invention can be used in conjunction with long line interconnect structure.

Figure 3:
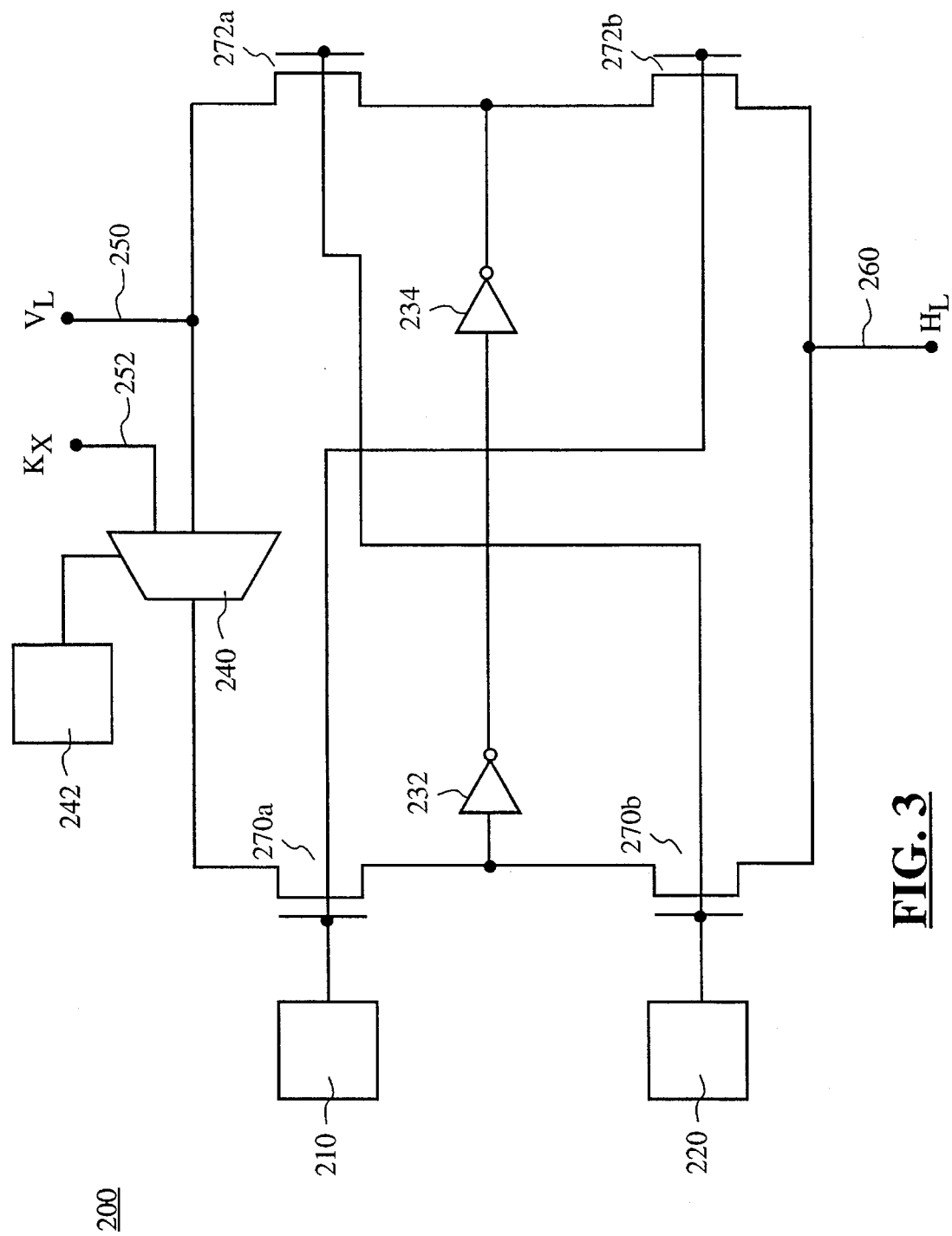
FIG. 3 is a schematic diagram of a multi-directional buffer circuit in accordance with one embodiment of the present invention having two input/output lines and one directional input line.

FIG. 3 is a schematic diagram of an embodiment of the present invention multi-directional buffer circuit. This embodiment 200 contains three programmable memory cells 210, 220 and 242. These memory cells can be realized using a number of well known memory structures, such as SRAM, EPROM, EEPROM, flash memory, PROM, antifuse material, etc. Circuit 200 contains an input/output signal line 250 (VL) which is coupled to an input of a multiplexer 240 and also coupled to an n-type transistor 272a. Multiplexer 240 also receives an input signal line 252 (Kx). The select line of the multiplexer 240 is controlled by programmable memory cell 242 and will select either input line 252 or input/output line 250 to output depending on the value programmed into memory cell 242.

The output of multiplexer 240 is coupled to an n-type transistor 270a which is also coupled to n-type transistor 270b which is coupled to the input of inverter 232. The output of inverter 232 is coupled to the input of inverter 234. The output of inverter 234 is coupled to the n-type transistor 272a and also to n-type transistor 272b. Transistor 272b is also coupled to an input/output line 260 (HL) which is also coupled to transistor 270b.

Memory cell 210 of FIG. 3 is coupled to the gates of transistors 270a and 272b. Memory cell 220 is coupled to the gates of transistors 270b and 272a. Transistors 270a–b and 272a–b form a transistor network. In an alternative embodiment, that the transistors of the network can also be implemented as p-type transistors or as a configuration of n-type and p-type transistors. However, under the alternate embodiment, the program states of the memory cells 210 and 220 would change, as is known in the art.

When memory cell 242 is programmed such that multiplexer 240 selects the VL input/output line 250 as input, and memory cell 210 contains a "1" and memory cell 220 contains a "0," then transistor 270a is ON, transistor 272b is ON and transistors 270b and 272a are OFF. This configuration allows a signal entering from input/output line 250 to be buffered by buffer circuits 232 and 234 and output over input/output line 260.

When memory cell 242 of FIG. 3 is programmed such that multiplexer 240 selects the Kx input line 252 as input, and memory cell 210 contains a "1" and memory cell 220 contains a "0," then transistor 270a is ON, transistor 272b is ON and transistors 270b and 272a are OFF. This configuration allows a signal entering from input line 252 to be buffered by buffer circuits 232 and 234 and output over input/output line 260.

When memory cell 210 contains a "0" and memory cell 220 contains a "1," then transistor 270b is ON, transistor 272a is ON and transistors 270a and 272b are OFF. This configuration allows a signal entering from input/output line 260 to be buffered by buffer circuits 232 and 234 and output over input/output line 250. In this configuration, the state of the memory cell 242 is ignored.

When memory cells 210 and 220 of FIG. 3 both contain a "0," the multi-directional buffer circuit 200 of the present invention acts as an open circuit across lines 250 and 260 and also as an open circuit across line 252 and line 260.

Buffer circuit 200 is multi-directional because either line 252 or line 250 can be sourced, buffered by circuits 232 and 234, and driven over line 260. In this way, an auxiliary signal over line 252 (e.g., an auxiliary clock signal) can be buffered by circuit 200 and driven across a line of the interconnect structure (e.g., line 260). Circuit 200 also allows a signal input over 260 to be buffered by circuits 232 and 234 and output over line 250.

Figure 4:
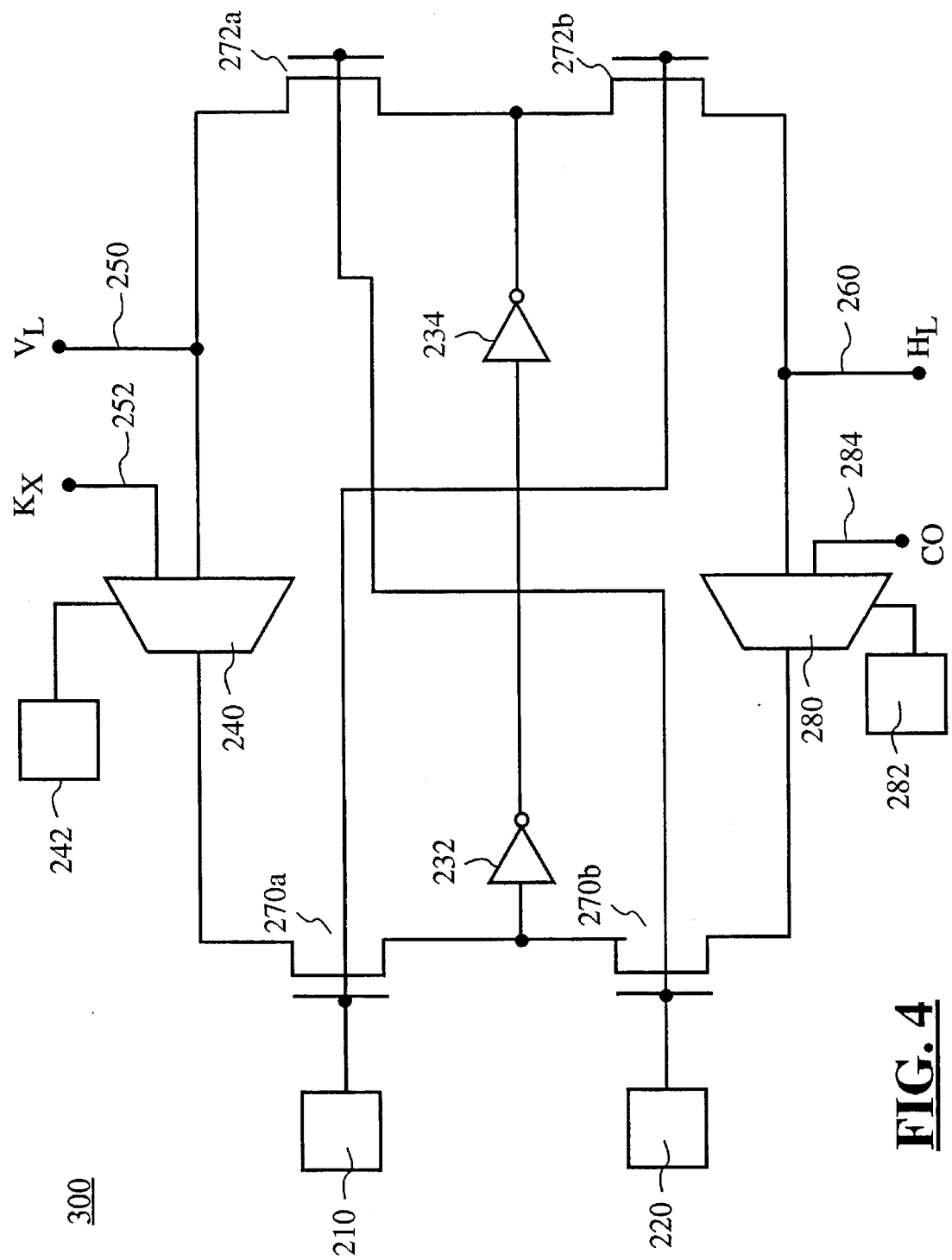
FIG. 4 is a schematic diagram of a multi-directional buffer circuit in accordance with one embodiment of the present invention having two input/output lines and two directional input lines.

FIG. 4 illustrates a second embodiment of the present invention analogous to the embodiment of FIG. 3 but having a second multiplexer 280 located across transistors 270b and 272b. Multiplexer 280 receives input from input/output line 260 (HL) and also receives an input form input line 284 (CO). Circuit 300 also contains an additional memory cell 282 which controls the select line of second multiplexer 280. Transistors 270a–b and transistors 272a–b comprise the analogous transistor network as used in buffer circuit 200 of FIG. 3.

With respect to signal lines 252 (Kx), 250 and 260, the operation of circuit 300 of FIG. 4 is analogous to the operation of circuit 200 of FIG. 3. However, it is appreciated that when memory cell 210 contains a "1" and memory cell 220 contains a "0," the value within memory cell 282 is ignored by the present invention because in this configuration, signals are not being sourced from lines 284 or 260. Likewise, when memory cell 210 contains a "0" and memory cell 220 contains a "1," the value within memory cell 242 is ignored because in this configuration, signals are not being sourced from lines 252 or 250.

Buffer circuit 300 of FIG. 4 allows a signal over line 284 or over line 260 to be sourced, buffered by circuits 232, 234 and driven over line 250. Multiplexer 280 provides the selection between lines 284 and 260 as the source of the signal. When memory cell 282 is programmed such that multiplexer 280 selects the HL input/output line 260 as input, and memory cell 210 contains a "0" and memory cell 220 contains a "1," then transistor 270b is ON, transistor 272a is ON and transistors 270a and 272b are OFF. This configuration allows a signal entering over line 260 to be buffered by buffer circuits 232 and 234 and output over input/output line 250. The value of memory cell 242 is ignored in this configuration.

When memory cell 282 of FIG. 4 is programmed such that multiplexer 280 selects the CO input line 284 as input, and memory cell 210 contains a "0" and memory cell 220 contains a "1," then transistor 270b is ON, transistor 272a is ON and transistors 270a and 272b are OFF. This configuration allows a signal entering over line 284 to be buffered by buffer circuits 232 and 234 and output over input/output line 250. The value of memory cell 242 is ignored in this configuration.

When memory cell 210 contains a "1" and memory cell 220 contains a "0," then transistor 270a is ON, transistor 272b is ON and transistors 270b and 272a are OFF. This allows a signal entering over line 250 or line 252 (depending on the state of memory cell 242) to be buffered by buffer circuits 232 and 234 and output over input/output line 260. In this configuration, the state of the memory cell 282 is ignored.

Circuit 300 of FIG. 4 is multi-directional because it offers the advantages of circuit 200 and also because either input line 284 or input/output line 260 can be sourced, buffered by circuits 232 and 234, and driven over input/output line 250. In this way, an auxiliary signal over line 284 (e.g., a carry out signal) can be buffered by circuit 300. Circuit 300 also allows a signal input over 250 to be buffered by circuits 232 and 234 and output over line 260.

Figure 5:
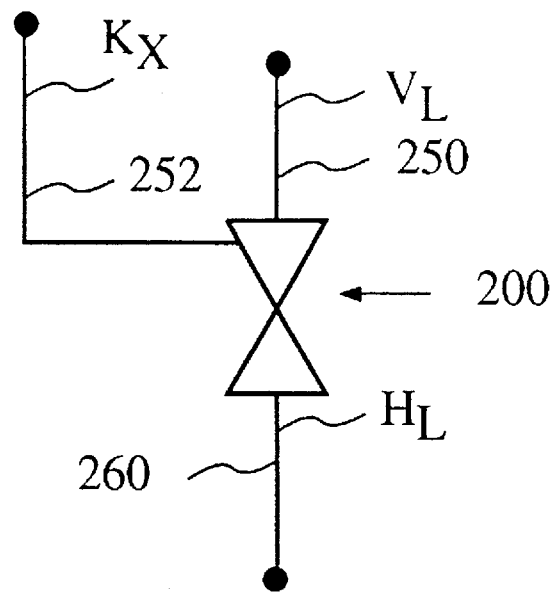
FIG. 5 is a logical diagram of the present invention buffer circuit of FIG. 3.

FIG. 5 is a logical block diagram of the circuit 200 of the present invention of FIG. 3 illustrating the auxiliary input signal 252 and the input/output line 250 and the input/output line 260. There are a number of well known methods and procedures that can be used within the scope of the present invention to program the memory cells 242, 210 and 220 of circuit 200 to allow selection of either line 252 or line 250 as the source input or to allow selection of line 260 as the source input. Table I below illustrates an exemplary truth table.

TABLE I

| Cell 242 | Cell 210 | Cell 220 | Configuration |
| --- | --- | --- | --- |
| 0 | 1 | 0 | Drive from 250 to 260 |
| 1 | 1 | 0 | Drive from 252 to 260 |
| (Don't care) | 0 | 1 | Drive from 260 to 250 |
| (Don't care) | 0 | 0 | Open Circuit |

Figure 6:
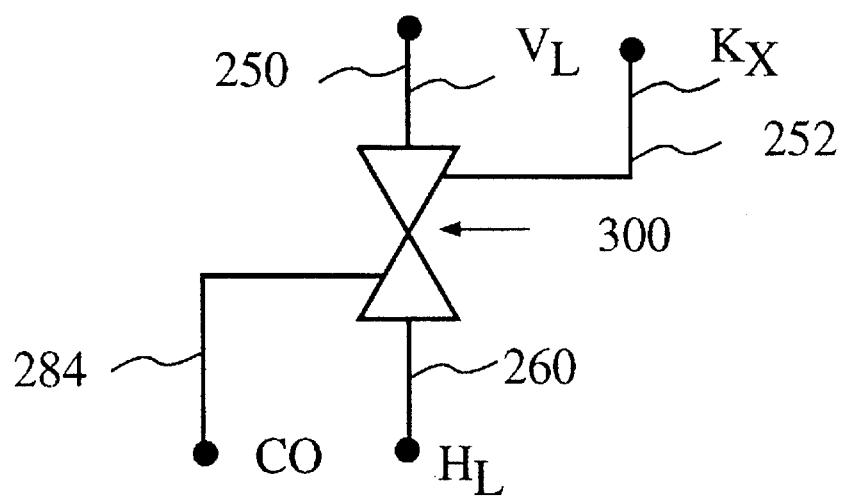
FIG. 6 is a logical diagram of the present invention buffer circuit of FIG. 4.

FIG. 6 is a logical block diagram of the circuit 300 of FIG. 4 illustrating the auxiliary input signal 252, the auxiliary input signal 284, the input/output line 250, and the input/output line 260. There are a number of well known methods and procedures that can be used within the scope of the present invention to program the memory cells 242, 210, 220, and 282 of circuit 300 to allow selection of either line 252 or line 250 as the source input or to allow selection of either line 284 or line 260 as the source input. Table II below illustrates an exemplary truth table.

TABLE II

| Cell 282 | Cell 242 | Cell 210 | Cell 220 | Configuration |
| --- | --- | --- | --- | --- |
| X | 0 | 1 | 0 | Drive from 250 to 260 |
| X | 1 | 1 | 0 | Drive from 252 to 260 |
| 0 | X | 0 | 1 | Drive from 260 to 250 |
| 1 | X | 0 | 1 | Drive from 284 to 250 |
| X | X | 0 | 0 | Open Circuit |

X = Don't Care

Figure 7:
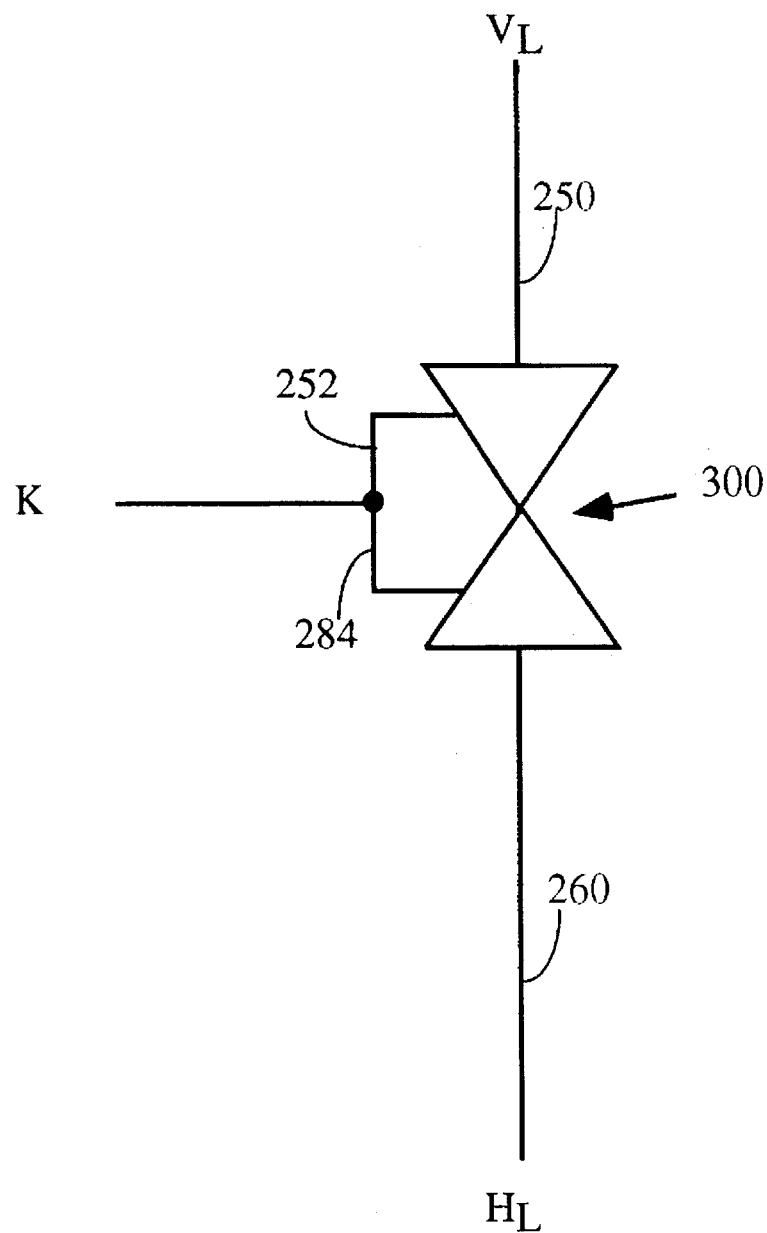
FIG. 7 is a logical diagram of the present invention buffer circuit of FIG. 4 having a same line as both auxiliary inputs.

FIG. 7 illustrates a logical block diagram of circuit 300 of FIG. 4 wherein the two auxiliary input signals are the same signal (e.g., signal K on lines 252 and 284). In this case, signal K can be buffered and driven over either 260 (if sourced from line 252) or driven over line 250 (if sourced from line 284). Alternatively, the signal on line 250 can be sourced, buffered and driven over line 260. Or, the signal on line 260 can be sourced, buffered and driven over line 250.

Figure 8:
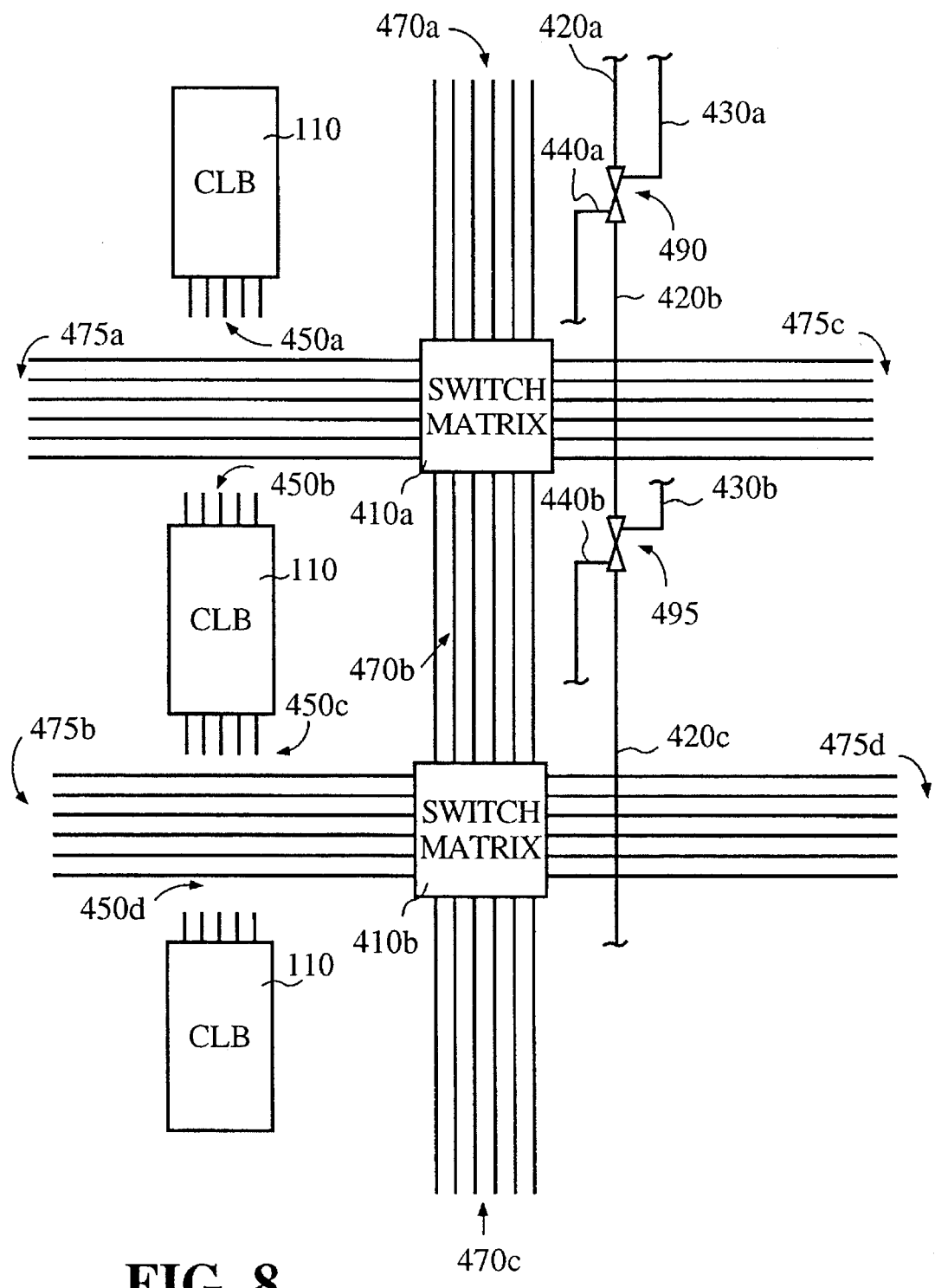
FIG. 8 illustrates use of the multi-directional buffer circuit of the present invention within interconnect structure a programable integrated circuit also of the present invention.

FIG. 8 is an illustration of a portion of the programmable interconnect structure of FPGA 100 of the present invention. Three exemplary CLBs 110 are shown having exemplary input and output signal lines 450a–450d. These lines couple at junctions having PIPs to horizontal local interconnect lines (e.g., 475a and 475b). Horizontal local interconnect lines 475*c* and 475*d* couple with signal lines from other CLBs (not shown). The horizontal local interconnect lines 475*a–d* are coupled to vertical local interconnect lines 470*a*–470*c* using switch matrix circuits 410*a* and 410*b*. Switch matrix circuits are well known in the art and contain a PIP at each signal line junction so that any signal line coupled to a switch matrix (e.g., 410*a* or 410*b*) can be programmably coupled to any other signal line coupled to the same switch matrix.

Also shown in FIG. 8 is a bi-directional long line composed of segments 420*a*, 420*b* and 420*c*. Between the line segments are multi-directional buffer circuits (e.g., 490 and 495) in accordance with the present invention. Buffer circuit 490 receives an input/output signal over line 420*a* and an input/output signal over line 420*b*. Circuit 490 of the present invention also receives an auxiliary input signal over line 440*a* and another auxiliary input signal over line 430*a*. The operation of circuit 490 is described with respect to FIG. 4. Buffer circuit 495 receives an input/output signal over line 420*b* and an input/output signal over line 420*c*. Circuit 495 of the present invention also receives an auxiliary input signal over line 440*b* and another auxiliary input signal over line 430*b*. The operation of circuit 495 is described with respect to FIG. 4.

Lines 440*a* and 430*a* and 440*b* and 430*b* represent auxiliary signal lines that can be coupled to the long line (e.g., segments 420*a–c*) using the multi-directional buffer circuits 490 and 495 of the present invention.

The preferred embodiment of the present invention, a multidirectional signal buffer is thus described for buffering a first input/output signal line or a third input line over a second input/output line or for buffering said second input/output line over said first input/output line, implemented using a pair of inverter circuits in either case. While the present invention has been described in particular embodiments, it should be appreciated that the present invention should not be construed as limited by such embodiments, but rather construed according to the below claims.

What is claimed is:

1. A buffer circuit comprising:

a first input/output line coupled to a first transistor through a multiplexer and coupled to a second transistor; a second input/output line coupled to a third and fourth transistor;

a third input line coupled to said first transistor through said multiplexer;

a driver circuit coupled to said first transistor, said second transistor, said third transistor and said fourth transistor; and programable memory coupled to control said first transistor, said second transistor, said third transistor and said fourth transistor in configurations such that a signal from said first input/output line is driven by said driver circuit over said second input/output line in a first configuration, a signal from said second input/output line is driven by said driver circuit over said first input/output line in a second configuration, and a signal from said third input line is driven by said driver circuit over said second input/output line in a third configuration.

2. A buffer circuit as described in claim 1 wherein said multiplexer circuit further comprises a programable memory cell for selecting between said first input/output line and said third input line in said first and third configurations.

3. A buffer circuit as described in claim 1 wherein said programmable memory comprises a first memory cell and a second memory cell wherein said first memory cell is coupled to gates of said first and third transistors and said second memory cell is coupled to gates of said second and fourth transistors.

4. A buffer circuit as described in claim 1 wherein said driver circuit comprises a pair of serially coupled inverter circuits.

5. A buffer circuit as described in claim 3 wherein said first, second, third and fourth transistors are n-type transistors and wherein said first and second programmable memory cells are SRAM cells.

6. A buffer circuit comprising:

a first input/output line coupled to a first transistor through a first multiplexer and coupled to a second transistor;

a second input/output line coupled to a third transistor through a second multiplexer and coupled to a fourth transistor;

a third input line coupled to said first transistor through said first multiplexer;

a fourth input line coupled to said third transistor through said second multiplexer;

a driver circuit coupled to said first transistor, said second transistor, said third transistor and said fourth transistor; and programmable memory coupled to control said first transistor, said second transistor, said third transistor and said fourth transistor in configurations such that a signal from said first input/output line is driven by said driver circuit over said second input/output line, a signal from said second input/output line is driven by said driver circuit over said first input/output line, a signal from said third input line is driven by said driver circuit over said second input/output line, and a signal from said fourth input line is driven by said driver circuit over said first input/output line.

7. A buffer circuit as described in claim 6 wherein said first multiplexer circuit further comprises a first programmable memory cell for selecting between said first input/output line and said third input line and wherein said second multiplexer circuit further comprises a second programmable memory cell for selecting between said second input/output line and said fourth input line.

8. A buffer circuit as described in claim 6 wherein programmable memory is also for controlling said first transistor, said second transistor, said third transistor, and said fourth transistor to implement an open circuit between said first input/output line and said second input/output line.

9. A buffer circuit as described in claim 6 wherein said programmable memory comprises a first memory cell and a second memory cell wherein said first memory cell is coupled to gates of said first and fourth transistors and said second memory cell is coupled to gates of said second and third transistors.

10. A buffer circuit as described in claim 6 wherein said driver circuit comprises a pair of serially coupled inverter circuits.

11. A programable integrated circuit having a buffer circuit comprising:

a first input/output signal line coupled to a first transistor of a transistor network through a multiplexer, and coupled to a second transistor of said transistor network, said multiplexer controlled by a first programmable memory cell;

a second input/output signal coupled to a third and a fourth transistor of said transistor network;

a third input line coupled to said first transistor of said transistor network through said multiplexer;

a driver circuit coupled to said transistor network; and second and third programable memory cells coupled to control said transistor network in configurations such that a signal from said first input/output line is driven by said driver circuit over said second input/output line in one configuration, a signal from said second input/output line is driven by said driver circuit over said first input/output line in a second configuration, and a signal from said third input line is driven by said driver circuit over said second input/output line in a third configuration.

12. A programable integrated circuit as described in claim 11 wherein said transistor network is for driving said signal from said first input/output line by said driver circuit over said second input/output line provided said multiplexer is configured by said first programmable memory cell to select said first input/output line and provided said second and said third programmable memory cells are programmed with a first state and a second state, respectively.

13. A programmable integrated circuit as described in claim 12 wherein said transistor network is for driving said signal from said third input line by said driver circuit over said second input/output line provided said multiplexer is configured by said first programmable memory cell to select said third input line and provided said second and said third programmable memory cells are programmed with said first state and said second state, respectively.

14. A programmable integrated circuit as described in claim 12 wherein said transistor network is for driving said signal from said second input/output line by said driver circuit and over said first input/output line provided said second and said third programmable memory cells are programmed with said second state and said first state, respectively.

15. A programmable integrated circuit as described in claim 11 wherein said transistor network comprises first, second, third and fourth transistors and wherein said second memory cell is coupled to gates of said first and third transistors and said third memory cell is coupled to gates of said second and fourth transistors.

16. A programmable integrated circuit as described in claim 15 wherein said driver circuit comprises a pair of serially coupled inverter circuits coupled between said first and second transistors and between said third and fourth transistors.

17. A programmable integrated circuit having a buffer circuit comprising:

a first input/output line coupled to a first transistor of a transistor network through a first multiplexer and coupled to a second transistor of said transistor network, said first multiplexer controlled by a first programmable memory cell;

a second input/output line coupled to a third transistor of said transistor network through a second multiplexer and coupled to a fourth transistor of transistor network, said second multiplexer controlled by a second programmable memory cell;

a third input line coupled to said first transistor of said transistor network through said first multiplexer;

a fourth input line coupled to said third transistor of said transistor network through said second multiplexer;

a driver circuit coupled between said transistor network; and third and fourth programmable memory cells coupled to control said transistor network in configurations such that a signal from said first input/output line is driven by said driver circuit over said second input/output line, a signal from said second input/output line is driven by said driver circuit over said first input/output line, a signal from said third input line is driven by said driver circuit over said second input/output line, and a signal from said fourth input line is driven by said driver circuit over said first input/output line.

18. A programmable integrated circuit as described in claim 17 wherein said transistor network is for driving said signal from said first input/output line by said driver circuit over said second input/output line provided said first multiplexer is configured by said first programmable memory cell to select said first input/output line and provided said third and fourth programmable memory cells are programmed with a first state and a second state, respectively, and wherein said transistor network is for driving said signal from said third input line by said driver circuit over said second input/output line provided said first multiplexer is configured by said first programmable memory cell to select said third input line and provided said third and fourth programmable memory cells are programmed with said first state and said second state, respectively.

19. A programable integrated circuit as described in claim 17 wherein said transistor network is for driving said signal from said second input/output line by said driver circuit over said first input/output line provided said second multiplexer is configured by said second programmable memory cell to select said second input/output line and provided said third and fourth programmable memory cells are programmed with a second state and a first state, respectively, and wherein said transistor network is for driving said signal from said fourth input line by said driver circuit over said first input/output line provided said second multiplexer is configured by said second programable memory cell to select said fourth input line and provided said third and fourth programmable memory cells are programmed with said second state and said first state, respectively.

20. A programmable integrated circuit as described in claim 17 wherein said third memory cell is coupled to gates of said first and fourth transistors and said fourth memory cell is coupled to gates of said second and third transistors.

21. A programmable integrated circuit as described in claim 20 wherein said driver circuit comprises a pair of serially coupled inverter circuits and is coupled between said first and second transistors and between said third and fourth transistors.

22. A programmable integrated circuit as described in claim 17 wherein one signal is supplied to both said third input line and said fourth input line.

* * * * *